United States Patent
Hipwell, Jr. et al.

(10) Patent No.: US 9,576,595 B1
(45) Date of Patent: Feb. 21, 2017

(54) TRANSFER PRINTING AN EPITAXIAL LAYER TO A READ/WRITE HEAD TO FORM AN INTEGRAL LASER

(71) Applicant: Seagate Technology LLC, Cupertino, CA (US)

(72) Inventors: Roger L. Hipwell, Jr., Eden Prairie, MN (US); Mark Ostrowski, Lakeville, MN (US); Marcus B. Mooney, Donegal (IE); Michael J. Hardy, Maghera (UA); Scott Eugene Olson, Eagan, MN (US); Mark Gubbins, Donegal (IE)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/946,116

(22) Filed: Nov. 19, 2015

Related U.S. Application Data (60) Provisional application No. 62/081,763, filed on Nov. 19, 2014.

(51) Int. Cl.
| | |
|---|---|
| *H01L 21/00* | (2006.01) |
| *G11B 5/127* | (2006.01) |
| *C30B 33/08* | (2006.01) |
| *C30B 29/42* | (2006.01) |
| *H01S 5/022* | (2006.01) |
| *H01S 5/30* | (2006.01) |
| *H01S 5/00* | (2006.01) |

(52) U.S. Cl.
CPC ............. *G11B 5/1272* (2013.01); *C30B 29/42* (2013.01); *C30B 33/08* (2013.01); *H01S 5/005* (2013.01); *H01S 5/0226* (2013.01); *H01S 5/02248* (2013.01); *H01S 5/3013* (2013.01)

(58) Field of Classification Search
CPC ....... G11B 5/1272; C30B 29/42; C30B 33/08; H01S 5/005; H01S 5/02248
See application file for complete search history.

(56) References Cited

U.S. PATENT DOCUMENTS

| | | |
|---|---|---|
| 6,294,450 B1 | 9/2001 | Chen et al. |
| 6,771,589 B2 | 8/2004 | Ueyanagi et al. |
| 7,354,809 B2 | 4/2008 | Yuan et al. |
| 7,557,367 B2 | 7/2009 | Rogers et al. |
| 7,622,367 B1 | 11/2009 | Nuzzo et al. |
| 7,927,976 B2 | 4/2011 | Menard |
| 7,972,872 B2 | 7/2011 | Shida et al. |
| 7,998,330 B2 | 8/2011 | Fang et al. |
| 8,261,660 B2 | 9/2012 | Menard |
| 8,333,860 B1 | 12/2012 | Bibl et al. |
| 8,456,969 B1 | 6/2013 | Mooney et al. |

(Continued)

OTHER PUBLICATIONS

Stadler et al., "Integrated Magneto-Optical Materials and Isolators: A Review", IEEE Photonics Journal, 2013, 16 pages.

*Primary Examiner* — Bradley K Smith
(74) *Attorney, Agent, or Firm* — Hollingsworth Davis, LLC

(57) ABSTRACT

A mounting surface of a read/write head is prepared to receive an epitaxial layer. The mounting surface is proximate a waveguide of the read/write head, and the waveguide is configured to receive an optical output from the epitaxial layer. The epitaxial layer is transfer printed on to the mounting surface. The mounting surface maintains a vertical alignment between the optical output and the waveguide. The epitaxial layer is processed to form a laser integrated with the read/write head.

20 Claims, 9 Drawing Sheets

(56) References Cited

U.S. PATENT DOCUMENTS

| | | | |
|---|---|---|---|
| 8,501,536 B2 * | 8/2013 | Mooney | G11B 5/105 |
| | | | 257/E21.499 |
| 8,518,204 B2 | 8/2013 | Hu et al. | |
| 8,664,668 B2 | 3/2014 | Ogihara et al. | |
| 9,105,286 B2 | 8/2015 | Boone, Jr. | |
| 2007/0215480 A1 | 9/2007 | Fang et al. | |
| 2009/0217517 A1 | 9/2009 | Pique et al. | |
| 2011/0018158 A1 | 1/2011 | Menard | |
| 2013/0330853 A1 | 12/2013 | Tischler | |
| 2014/0373898 A1 | 12/2014 | Rogers et al. | |
| 2015/0036468 A1 * | 2/2015 | Boone, Jr. | G11B 5/314 |
| | | | 369/13.32 |
| 2015/0213819 A1 * | 7/2015 | Gokemeijer | G11B 5/4866 |
| | | | 369/13.13 |

* cited by examiner

Section A-A

TRANSFER PRINTING AN EPITAXIAL LAYER TO A READ/WRITE HEAD TO FORM AN INTEGRAL LASER

RELATED PATENT DOCUMENTS

This application claims the benefit of Provisional Patent Application Ser. No. 62/081,763 filed on Nov. 19, 2014, to which priority is claimed pursuant to 35 U.S.C. §119(e), and which is incorporated herein by reference in its entirety.

SUMMARY

The present disclosure is related to transfer printing an epitaxial layer to a read/write head to form an integral laser. In one embodiment, a method involves preparing a mounting surface of a read/write head to receive an epitaxial layer. The mounting surface is proximate a waveguide of the read/write head, and the waveguide is configured to receive an optical output from the epitaxial layer. The epitaxial layer is transfer printed on to the mounting surface. The mounting surface maintains a vertical alignment between the optical output and the waveguide. The epitaxial layer is processed to form a laser integrated with the read/write head.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same/analogous components in multiple figures. The figures are not necessarily to scale.

DETAILED DESCRIPTION

In the following description, reference is made to the accompanying set of drawings that form a part of the description hereof and in which are shown by way of illustration of several specific embodiments. It is to be understood that other embodiments are contemplated and may be made without departing from the scope of the present invention. The following detailed description, therefore, is not to be taken in a limiting sense.

This disclosure relates to read/write heads used in heat-assisted magnetic recording (HAMR), also referred to as thermally-assisted recording (TAR), thermally-assisted magnetic recording (TAMR), energy-assisted magnetic recording (EAMR), etc. In this disclosure the terms "read/write head," "slider," and "head" will be used interchangeably. In a HAMR device, a read/write head includes an energy source (e.g., a laser diode) that heats a recording medium during writing. The HAMR read/write head generally includes some form of optical transmission path, such as a waveguide and near-field transducer, that shapes and directs the energy from the energy source to the recording medium.

In current implementations, the read/write head and laser diode are formed using separate processes, aligned using a surface-mount placement process (e.g., pick and place), and bonded together (e.g., using solder). While this type of assembly process is well-established for assembly of electronic components, there are challenges in mass-assembly of HAMR read/write heads using these processes.

One challenge in assembling laser diodes onto a read/write head is the precise alignment needed. While electrical components can operate if misaligned so long as the conductive paths are sufficiently established, misalignment between a laser and read/write head can result in a loss of optical efficiency that can render the head unusable. Another challenge relates to the size of the resulting assembly. The read/write head has a limited vertical distance (normal to the recoding surface) in which to operate. In some implementations, the addition of a laser and intermediate structures (e.g., submounts) can exceed the available spacing. Such additional structure can add undesirable weight, as do the laser packaging and electrical joints that electrically couple the laser to the read/write head.

In the present disclosure, hard drive recording heads are proposed onto which at least part of a semiconductor laser or material to form a laser (e.g., epitaxial layer) is not self-supporting (e.g., not a separately packaged device) but is physically transferred to a target read/write head substrate that does contain already or will contain (after further processing) the other components of the read/write head (e.g., write coil and poles, reader stack) without the use of a separate or intermediate support during attachment. Carrying the semiconductor laser with the read/write head substrate, without a separate or intermediate support substrate, can help to reduce the size and simplify the shape and connection methods, and it can also allow for the use of laser geometries and designs that are very different from simple edge-emitting cleaved facet lasers that have been proposed in the past. The present disclosure describes integration and processing features that enable a successful and manufacturable integrated use of transfer print technology in HAMR heads.

In at least some cases, parts of the laser (e.g., GaAs active region) are incompatible with epitaxial growth on the target substrate. As such, the laser cannot be formed using the same layer deposition processes used to form the magnetic and optical components that are integrated into the head. In embodiments described below, the laser may instead be formed on the substrate by transfer printing a thin, non-self-supporting crystalline layer (epitaxial layer), or a stack of such layers, from a growth substrate on which they were formed to a target substrate. Thereafter, the epitaxial layer and substrate are further processed (e.g., masked etched, further layers added) to form the integrated laser.

Figure 1:
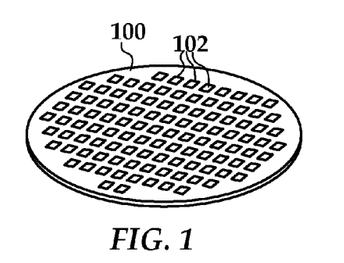
FIGS. 1-5 are diagrams showing a transfer printing process according to an example embodiment.

This process of transferring non-self-supporting layers of epitaxial-growth-incompatible layers is referred to herein as On-Wafer Laser (OWL) process integration. This process may also be referred to as transfer printing, dry transfer printing, nanoprinting, etc. In FIGS. 1-5, block diagrams illustrate transfer printing of components onto a recording head according to an example embodiment. In FIG. 1, a donor substrate 100 includes a number of components 102 (e.g., epitaxial layers) formed using a first process (e.g., crystalline growth). The components 102 may include one or more layers of materials that have been processed via photolithography and/or other processes to attain a final shape and position on the substrate 100. A sacrificial layer may also be included between the components 102 and the substrate 100 to allow separation. This fabrication could include some or all of the following: epitaxial material layer, adhesion or protection layers, carrier layers (to increase thickness for easier transport), bonding layers to aid in best print transfer, and integration layers to enable subsequent integration (e.g., stop material to allow planarization after integration).

Figure 2:
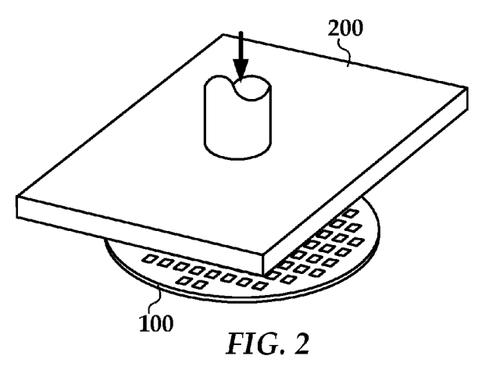
Figure 3:
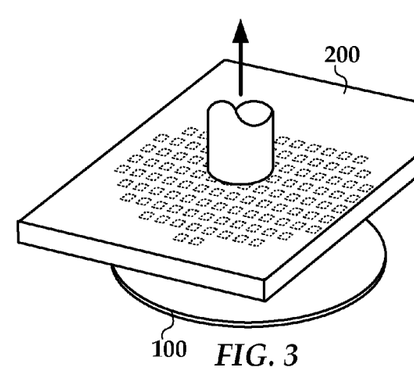

As seen in FIG. 2, a transfer print head 200 is lowered onto the substrate material (or material stack) onto a target substrate (typically of a different material). The transfer print head 200 is lifted as shown in FIG. 3, taking the components 102 with it. In this way, "islands" of the component material are then transferred to a target substrate 210 as shown in FIGS. 4-5.

Figure 4:
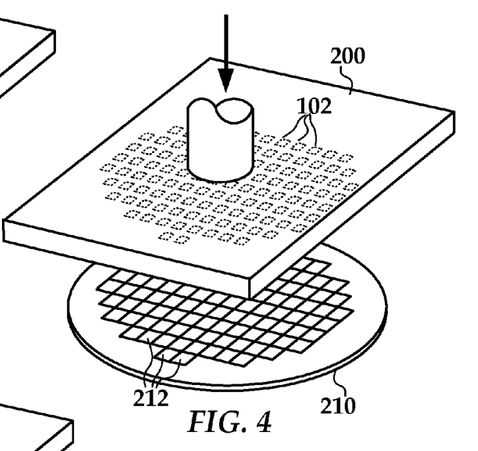
Figure 5:
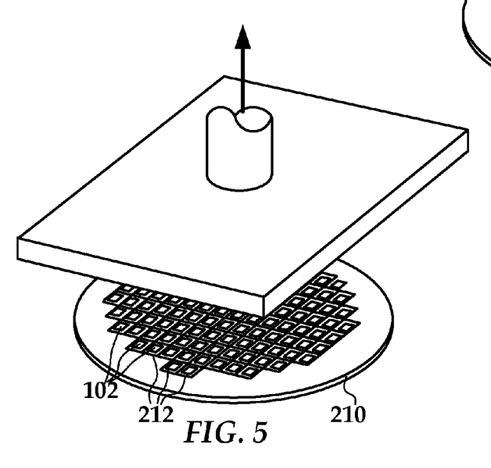

As seen in FIG. 4, the transfer print head 200 is lowered over a wafer 210 that includes a number of partially-processed recording heads 212. The transfer print head 200 presses the components 102 on to the wafer 210 and is then pulled away as seen in FIG. 5. This attaches the components 102 to the recording heads 212. Afterwards, the wafer 210 is further processed, e.g., etching the components 102 to final shape and alignment, and adding additional layers of material to form additional recording head components.

Figure 6A:
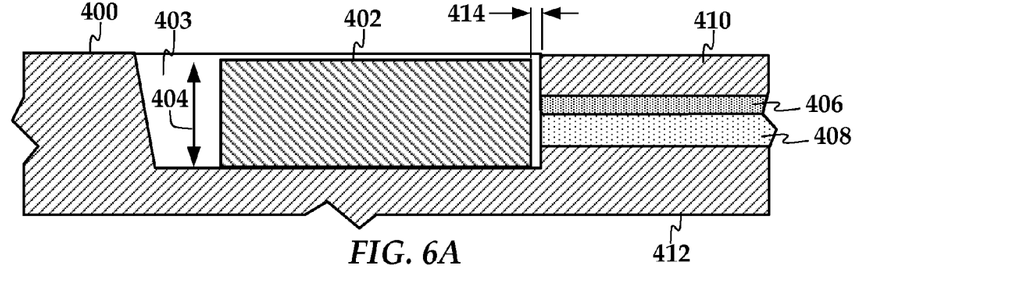
FIGS. 6A and 6B are respective cross-sectional and top views illustrating alignment between one or more epitaxial layers and a slider body according to an example embodiment.
Figure 6B:
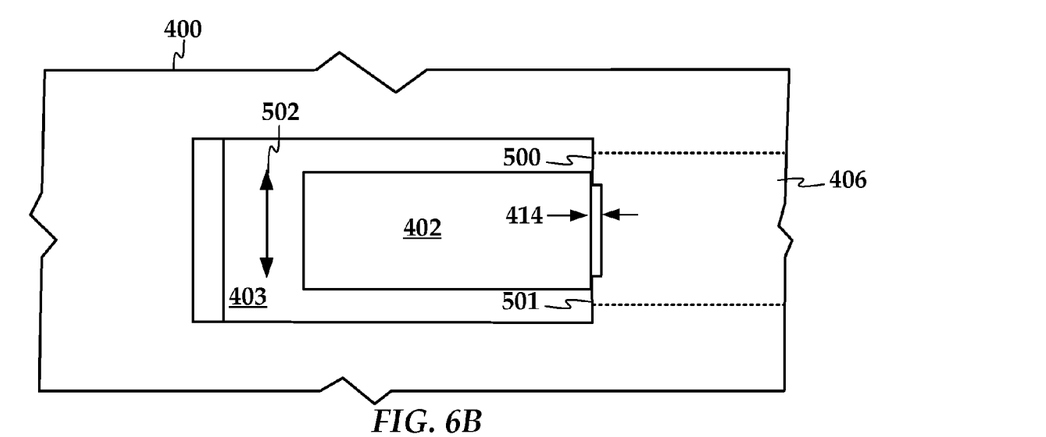

One aspect of the OWL concept is that the transfer printing of the laser epitaxial layers (e.g., GaAs) can have a relatively coarse alignment (e.g. several microns or 10's of microns alignment) with respect to the read/write head elements because the lateral patterning of the laser-defining elements (e.g., electrodes, ridges, facets) can be formed using subsequent wafer-level lithography and therefore will inherently be well-aligned (e.g, sub-micron alignment) to existing wafer alignment features. In FIGS. 6A and 6B, respective cross-sectional and top views illustrate alignment between one or more epitaxial layers 402 and a slider body 400 according to an example embodiment.

In some cases, it is desired to process some of the optical elements prior to transfer printing of the laser or laser material. This could, for example, enable precise definition of the optical input coupler surface for optical coupler layer 408 in FIG. 6A. In FIG. 6A, arrow 404 represents relative vertical alignment between the epitaxial layer 402 and the slider body 400. In this example, the epitaxial layer 402 is located in a cavity 403 of the slider body 400, although the concepts may be similar for embodiments where the epitaxial layer(s) are mounted to an outer surface. When the epitaxial layer 402 is energized (e.g., after assembly with other laser diode components), light is launched into a waveguide core 406. A coupling layer 408 facilitates efficient coupling of the light into the core 406, e.g., having an index of refraction between that of the core 406 and surrounding cladding layers 410, 412. In this example, the cladding layers 410 are shown being made of the same material as the slider substrate (e.g., $Al_2O_3$), although additional cladding layers of different materials may be used instead.

The epitaxial layer 402 is shown separated from the ends of the core 406, and coupler by a gap 414. The size of the gap 414 is dictated, e.g., by the wavelength of the emitted light, refractive properties of the various materials. The gap 414 may be backfilled, e.g., using a transparent material with a desired index of refraction such as ALD alumina. As seen in FIG. 6B, the gap 414 can be defined by stops 500, 501 etched into a wall of the cavity. The stops 500, 501 control a longitudinal alignment between the epitaxial layer 402 and the slider body 400. The relative alignment in the other surface direction is indicated by arrow 502, which represents a lateral alignment between the epitaxial layer 402 and the slider body 400.

Figure 6C:
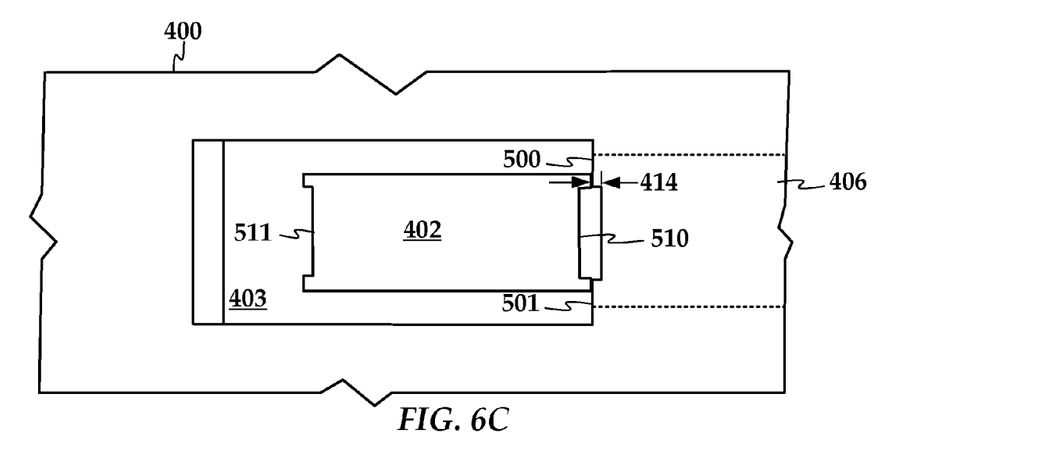
FIG. 6C is a top view illustrating alignment between one or more epitaxial layers and a slider body according to an example embodiment.

Another embodiment is shown in the top view of FIG. 6C, which shows the structure of FIG. 6B after optional subsequent processing. The gap 414 is etched ahead of time (e.g., into the waveguide core 406 and/or optical input coupler 408) and used for lateral referencing. After bonding, a facet 510 where the laser diode will emit could be etched into the epitaxial layer 402 after bonding, while leaving the lateral referencing intact. This would allow established processing of the etched facet at the wafer level and associated alignment with the rest of the wafer features using lithography mask alignment. In this case the final gap width is defined after the final etch. A rear facet 511 is also shown etched into the epitaxial layer 402, which can facilitate precise tuning of the laser properties, e.g., wavelength of emitted light.

The vertical alignment 404 may have a greater impact than the lateral alignment 403 on coupling efficiency between an OWL laser and the slider waveguides (e.g., ~1 μm alignment tolerance for lateral alignment). To that end, features and methods are described below that provide reference surfaces and process methods to precisely align incoming epitaxial layers that define the laser emission output with optical layers of the slider. The optical layers may be in the wafer before the epitaxy is attached and/or formed after the attachment of the laser epitaxial material.

Figure 7A:
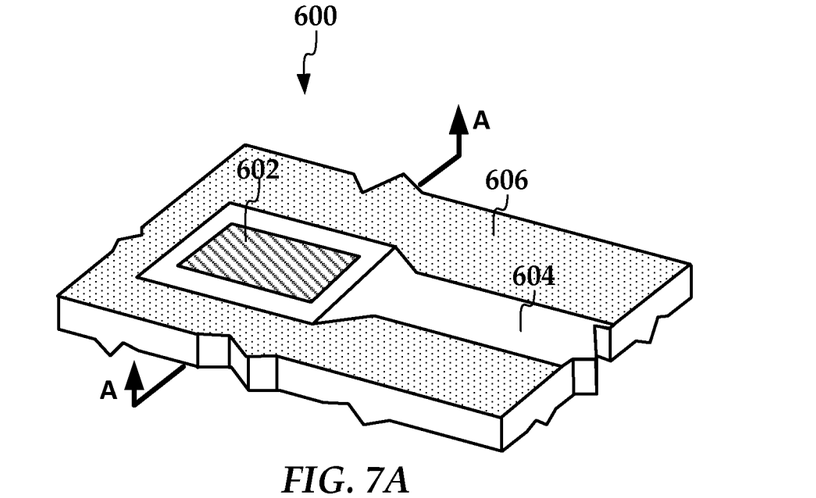
FIGS. 7A, 7B and 8 illustrate the reference surfaces formed on a slider according to example embodiments.
Figure 7B:
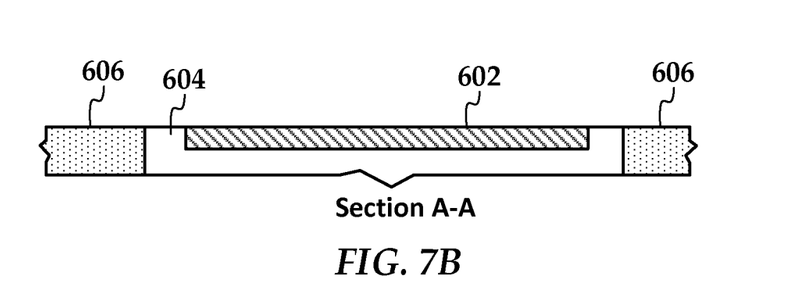
Figure 8:
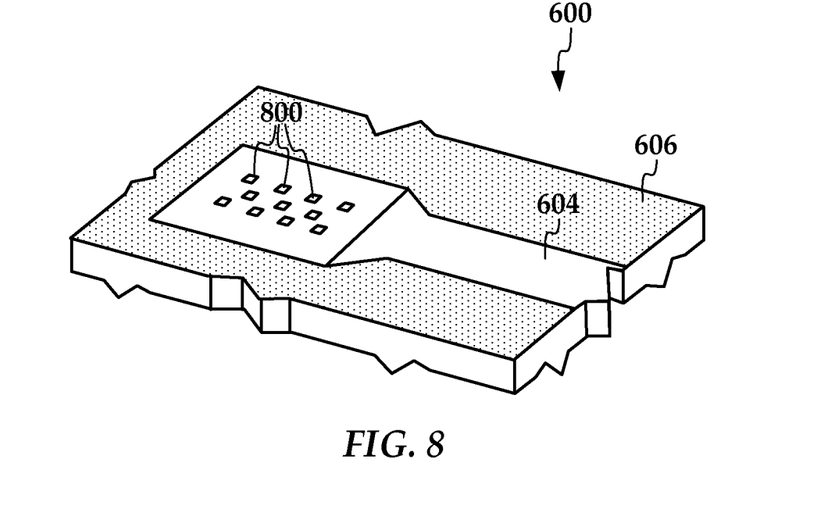

In FIGS. 7A, 7B, and 8, perspective and cross-sectional views illustrate the reference surfaces formed on a slider according to example embodiments. In FIG. 7A, surface of slider 600 is shown which includes a region 602 configured to receive one or more epitaxial layers used to form a slider-integrated laser. A cross-sectional view corresponding to section line A-A is shown in FIG. 7B. The region 602 may include a material suitable for surface bonding and/or have preferred electrical, thermal, or thermomechanical characteristics. A waveguide surrounding material 604, e.g., a dielectric, may be part of the cladding, coupling layer, and/or waveguide core. The waveguide material 604 is planarized to the bonding surface region 602 via rigid material 602, e.g., chemical-mechanical planarization (CMP) stop, under the laser. In another example shown in FIG. 8, the bonding surface may further (or instead) include posts 800 embedded in waveguide cladding material or the like. The posts 800 may be configured as mechanical lapping stoppers/guides 800 that are formed to provide process control of the reference surface being created. In other embodiments, the posts 800 may include electrical leads that facilitate electrically connecting one side of the laser that is formed from the epitaxial layer.

Figure 9:
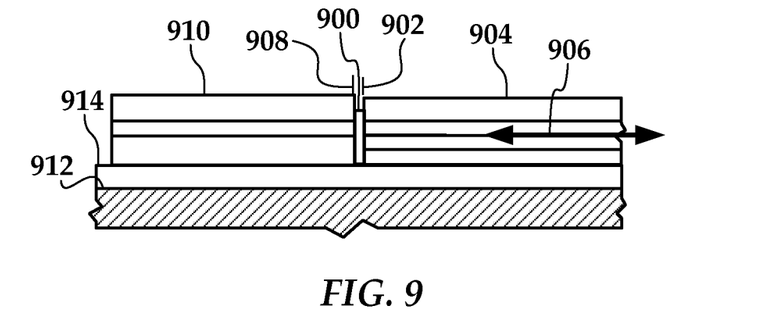
FIG. 9 is a cross-sectional view showing a lateral mechanical stop according to an example embodiment.

In FIG. 9, a cross-sectional view shows a lateral mechanical stop 900 according to an example embodiment. The stop 900 may be used on an input surface 902 of a waveguide 904, the surface 902 being normal to a light propagation direction 906. The surface 902 faces an emitting facet side 908 of epitaxy layer(s) 910. A pre-defined gap between surfaces 902 and 908 creates a controlled spacing to coupler, which allows a pre-defined/etched optical coupler region and better lateral spacing control. The gap may be formed in conjunction with the print transfer process.

The facet surface 908 may be etched ahead of time on that side of the epitaxy material (other patterning and alignment is from wafer-level photolithography). In another embodiment, the stoppers 900 may be used to position the epitaxy close to the pre-etched coupler input surface 902, and the epitaxy etched facets being patterned in the critical regions after bonding. (see also FIG. 5B). The latter gets the benefit of more-precise positioning of the epitaxial material to the etched coupler input 902 and keeps the facet alignment, etching, and coating process to the wafer-level on both surfaces.

The vertical alignment between the epitaxial layer(s) 910 and the waveguide 904 is controlled by a planarized reference surface 912. A bonding layer 914 may formed on the planarized surface and include materials that facilitate strong adhesion between the epitaxial layer(s) 910 and the planarized reference surface 912. The planarized reference surface 912 may include features that ensure accurate vertical alignment, such as lapping guides described as follows.

Figure 10:
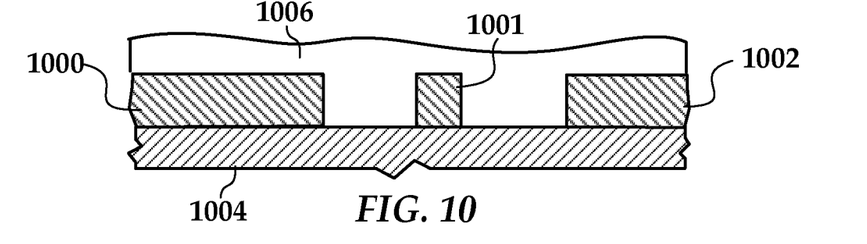
FIGS. 10-12 are block diagrams illustrating the formation of vertical alignment features according to an example embodiment.
Figure 11:
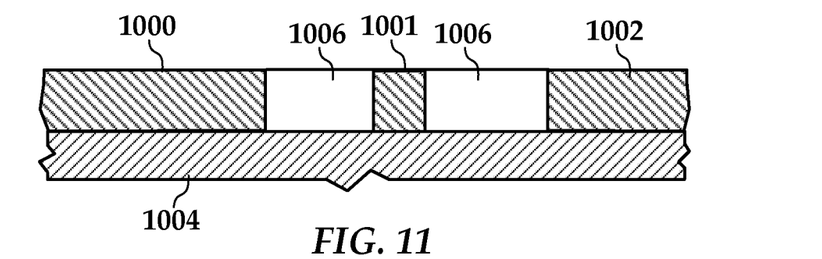
Figure 12:
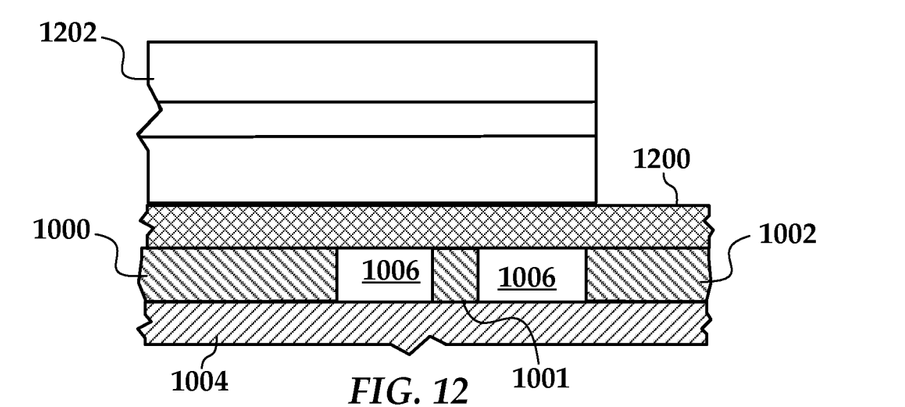

In FIGS. 10-12, block diagrams illustrate the formation of vertical alignment features according to an example embodiment. In FIG. 10, CMP/planarization reference features 1000-1002 (e.g., lapping guides) are formed on a substrate 1004. The features 1000-1002 may be similar to the mechanical lapping stoppers/guides 800 shown in FIG. 8. A material 1006 (e.g., dielectric bottom cladding layer) is formed over the features 1000-1002. As seen in FIG. 11, the material 1006 is planarized such that it is level with the tops of features 1000-1002. As seen in FIG. 12, a bonding layer 1200 is formed over the planarized surface of features 1000-1002 and material 1006, and epitaxial layers 1202 are then transfer-printed onto the bonding layer 1200. Subsequent operations may be performed to form a laser based on the epitaxial layers 1202. For example, subsequent etching can be used to define a facet on an end of the epitaxial layers 1202, and form other optical features such as channels, mirrors, etc. Other subsequent processes may include transfer printing, coating, and/or depositing additional material, e.g., electrical leads, heat sinks, encapsulation layer, etc.

Because the epitaxial layer is very thin (e.g., ~4 um) and not part of a larger, similar substrate (as in conventional laser fabrication), it may be more susceptible to thermally induced stresses and strains during normal operation of the laser in general, and in particular in view of the surrounding HAMR-related thermal factors. Due to laser power requirements needed to meet HAMR recording requirements and size constraints of the read/write head, it may be desirable to have features that efficiently transport heat from the laser cavity as well as maintain a uniform temperature over the laser device. These features may be on all sides of the laser diode and could include full encapsulation of a thermal or stress-absorbing material.

Embodiments may include thermal conductive paths/materials under or around epitaxial layers. For example, in FIG. 13, a thermal layer 1300 according to an example embodiment is shown between an epitaxial layer 1302 is shown on a base layer 1304. The thermal layer 1304 may include any combination of a substrate, optical layers, bonding layers, etc., suitable for forming a thermal conduction path under the epitaxial layer 1302 and that buffers the epitaxial layer 1302 from thermomechanical stresses. A similar arrangement is shown in FIG. 14, where a thermal material 1400 encapsulates one or more epitaxial layers 1402, all of which are formed in a base layer 1404. A window 1406 is shown that allows light to exit from the epitaxial layer 1402.

The surrounding thermal material 1400 shown in FIG. 14 may be applied in multiple steps. For example, a first portion 1400a may be formed first as part of preparing a mounting surface to receive the epitaxial layer 1402, similar to the layer 1300 shown in FIG. 13. After the epitaxial layer 1402 is bonded and processed (e.g., etching of facet and other laser features), portion 1400b may be formed that surrounds the rest of the epitaxial layer 1402. Both portions 1400a-b form a thermal conduction path around the epitaxial layer 1402 that provides buffering from thermomechanical stresses.

Figure 14:
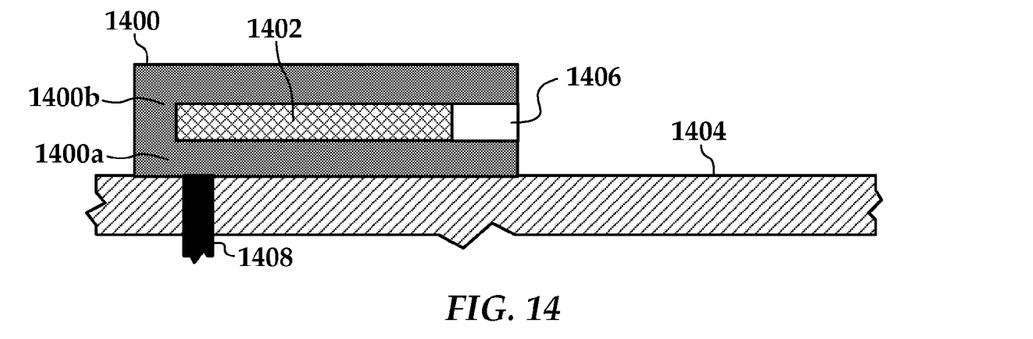
Figure 15:
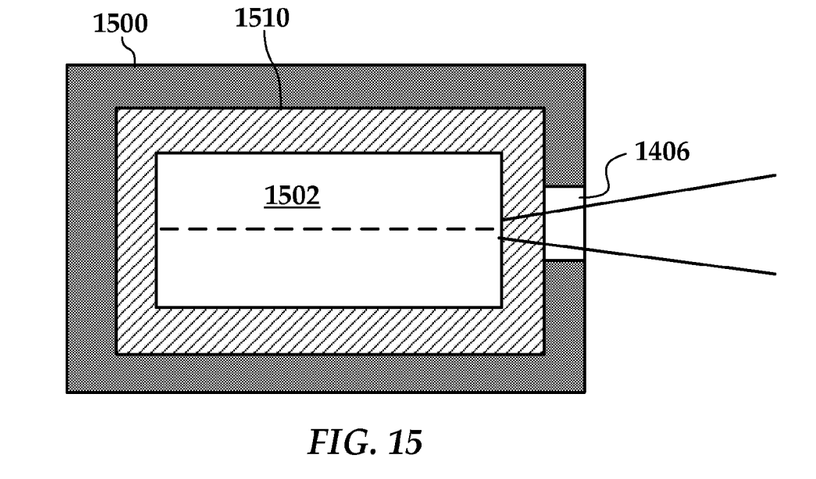

In FIG. 15, a top view shows a similar arrangement as FIG. 14, with a thermal material 1500 encapsulating one or more epitaxial layers 1502. The thermal material 1500 includes a window 1406 that allows light to escape. An intermediate layer 1510 is located between the outer thermal material and epitaxial layers 1502. The intermediate layer 1510 may include an optically transparent material that is also thermally conducting. The layer 1510 may be provided to increase optical efficiency and/or for thermal management.

Figure 13:
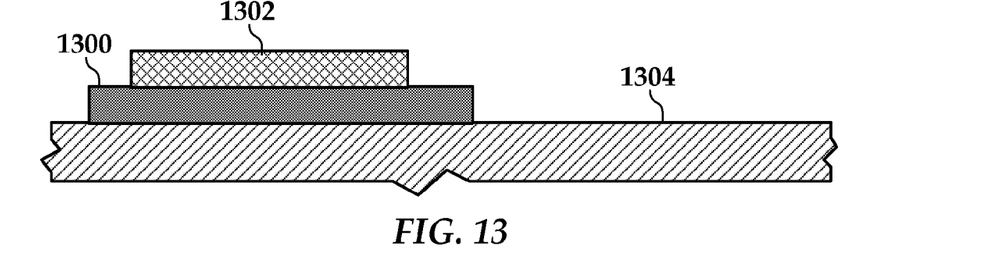
FIGS. 13-15 are diagrams illustrating thermal conduction paths according to example embodiments.

In the embodiments shown in FIGS. 13-14, the thermal/surrounding layers may be mechanically compliant to minimize thermally-induced stress on the laser caused by mismatches with the AlTiC or alumina used as the head substrate. The thermal layers may be configured as bonding surface with a high thermal conduction to improve laser thermal management. Thermal conduits from the thermal/bonding layers or near epitaxial structure may be included for efficient thermal conduction to substrate (see, e.g., conduit 1408 in FIG. 14). These thermal conduits may draw heat to primary cooling sinks, such as the air bearing surface and suspension. Silicon carbide or other mechanically strong material may be used to provide mechanical outer shell or buffer wall that is not necessarily directly in contact with the epitaxial layers, e.g., using intermediate layers such as layer 1510 in FIG. 15. Such intermediate layer may include thermally conductive or optically preferred material.

Either separately or in conjunction with the thermal and stress considerations of the materials and layers under or around the laser epitaxy, it may be preferred to deposit/pattern a specific material that is different than the other material in that area of the head. This could be from the requirements for direct material bonding of the laser epitaxial material (e.g. GaAs) to the AlTiC substrate (which may be covered in $Al_2O_5$ and other materials). This "bonding area" may need special features or processing to ensure referencing and planarity with the surrounding features.

A bonding pad (e.g., region 602 in FIG. 6) may use a different material ideal for direct bonding between the epitaxial layers and the substrate. Process methods as described above help to ensure planarity/reference to this bonding pad. A bonding pad may use a different material and have at least of the electrical connections routed to the laser from underneath. This may facilitate a simpler laser forming process, e.g., not needing multi-level epi etching. A bonding pad may include a higher thermal conduction layer for better laser thermal management.

Figure 16:
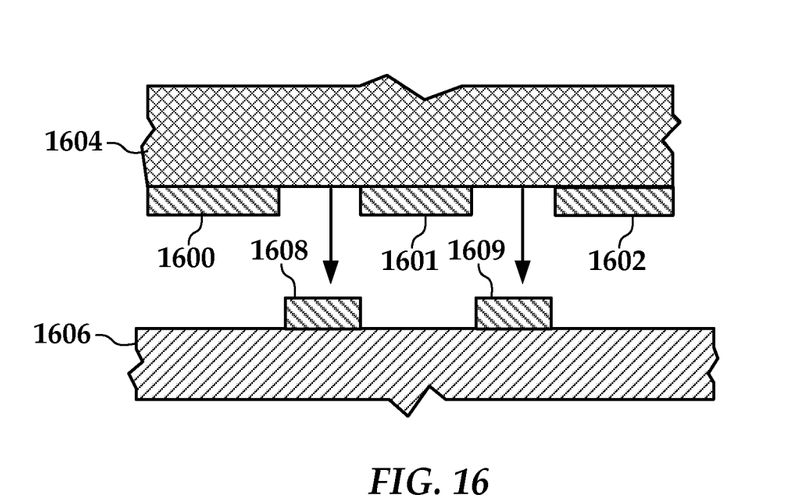
FIGS. 16 and 17 are a diagrams showing additional alignment features according to example embodiments.

While transfer printing may be able to provide good, uniform alignment in parallel of multiple islands of the transfer material, there may be features that could be added to the target substrate and/or the material being transferred to improve the alignment tolerance further. In FIG. 16, a diagram shows additional alignment features according to an example embodiment. An epitaxial layer assembly 1604 (e.g., coupon) includes alignment features 1600-1602 that positively engage corresponding alignment features 1608-1609 located on a substrate 1606. These features 1600-1602, 1608-1609 may engage to shift the epitaxial layer assembly 1604 into lateral position during initial contact and/or later on, e.g., upon application of pressure to the epitaxial layer assembly 1604 after placement.

Figure 17:
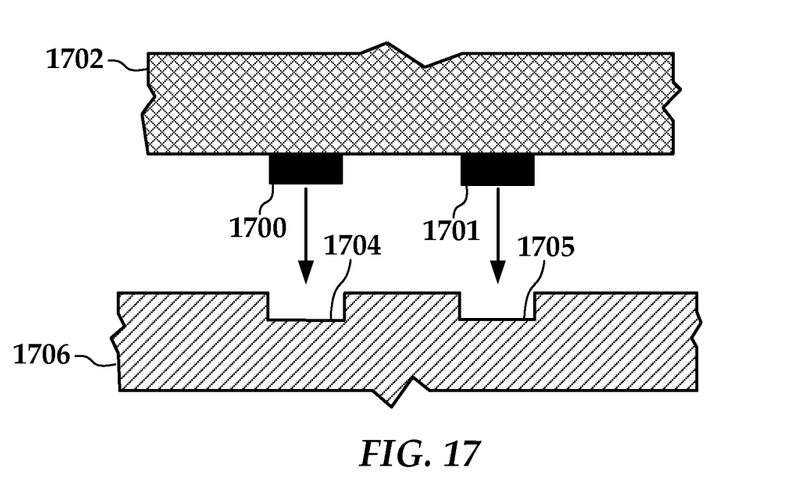

In FIG. 17, a block diagram shows alignment features according to another example embodiment. In this features, magnetic features 1700-1701 on an epitaxial layer coupon 1702 and corresponding features 1704-1705 on a substrate/wafer 1706 may be used to pull the epitaxial layer coupon 1702 into correct alignment with the substrate 1706. Mechanical stops or guides may be used on the target wafer and/or definition of material being transferred. It will be understood that the features 1700-1701 may be instead located on substrate/wafer 1706 and corresponding features 1704-1705 may instead be located on coupon 1702.

Figure 18:
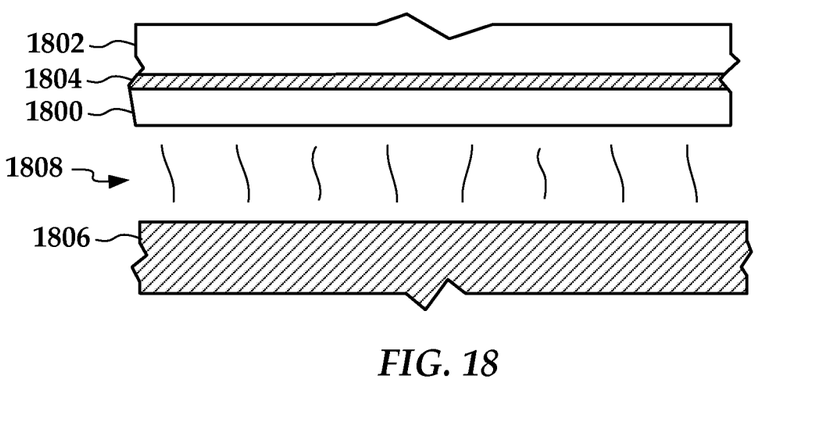
FIG. 18 is a diagram illustrating direct bonding of a laser material according to an example embodiment.

Lasers bonded to recording heads may require good heat conduction away from the laser device in order to facilitate sufficient reliability for HAMR. Direct bonding of the laser material to the recording head material, instead of bonding to an intermediate adhesive layer may facilitate heat flow away from the laser. In FIG. 18, a diagram illustrates direct bonding of a laser material according to an example embodiment. Laser material layer 1800 (e.g., epitaxial layers) is attached to donor wafer 1802 by way of sacrificial material 1804. A recording head wafer 1806 is exposed to plasma 1808 before the laser material layer 1800 is transferred to the recording head via subsequent transfer printing. The plasma 1808 activates the surfaces of the laser material layer 1800 and recording head wafer 1806 to assist in the bonding. After bonding, the donor wafer 1802 and sacrificial layer are removed.

Because the lasers are built into the substrate, it may be necessary to test them at various stages in the processing of the wafer that contains the read/write heads. Adding in test structures can be used to ensure a wafer is functioning well. In reference to FIG. 19, a diagram shows testing components on a wafer 1900 according to an example embodiment. The wafer 1900 includes a plurality of read/write heads 1902 that are processed together. Each of the wafers has a laser that has been transfer printed (e.g., laser 1904) as well as an integrated light delivery path (e.g., waveguide and near-field transducer 1908). Each laser also includes test pads (e.g., test pads 1906-1907).

Figure 19:
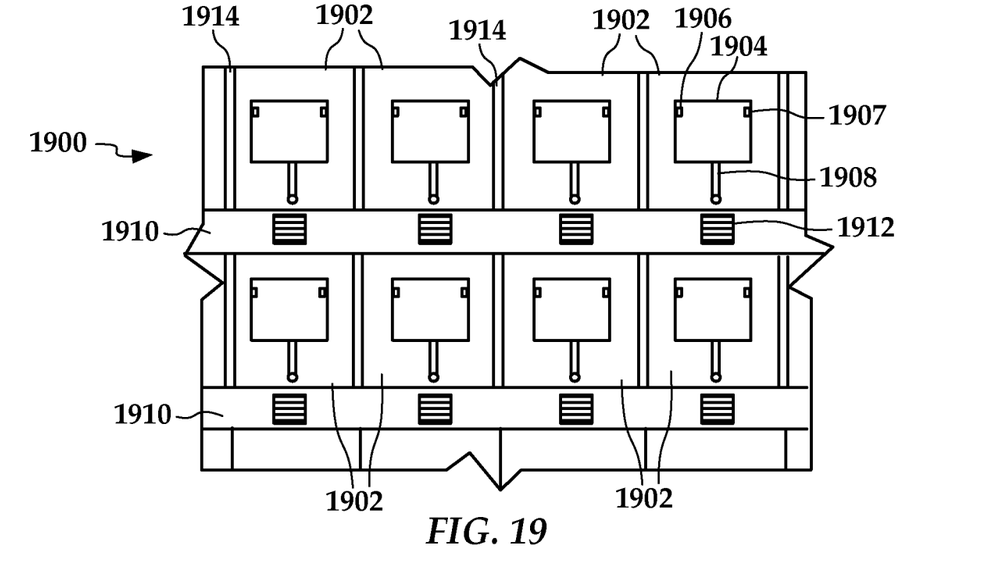
FIG. 19 is a diagram showing the testing of components on a wafer according to an example embodiment.

The wafer 1900 includes slices lane 1910 between each row of read/write heads 1902. In subsequent processing, the rows of read/write heads 1902 are separated at the slice lanes 1910, e.g., by cutting and/or shearing the wafer. The cut along the slice lanes 1910 forms air-bearing surfaces of the individual read/write heads 1902. Thereafter, the rows are subsequently separated into individual read/write heads by cutting/shearing at dice lanes 1914.

As shown here, the slice lances include grating structures (e.g., grate 1912) that are optically coupled to receive an output from light delivery paths of the read/write heads 1902. The grating structure facilitates out-of-plane measurement of laser functionality while the heads 1902 are still part of the wafer 1900. Generally, a test probe or array of probes applies power via the test pads (e.g., pads 1906-1907), and a sensor or array of sensors can be arranged to detect optical output at the grating structures. Other scattering features (e.g., arrays of pegs, holes, bumps, etc.) can be similarly formed in the slice lanes 1910 or dice lanes 1914.

The grating structures 1912 could be part of a sacrificial structure as shown, or be integrated with the heads. In other embodiments, alternate or additional integrated optical power monitor features (either permanent or sacrificial) may be included, such as bolometer sensor in the emission path. In such a case, another test pad may be provided to read the electrical sensor output of a bolometer or similar sensor. Quantum dots or photo-luminescent material may also or instead be used to provide wafer-level indication of laser power output. Such features may be integrated (e.g., included with the finished read/write head) or sacrificial (e.g., placed in the slice lanes 1910 or dice lanes 1914 between the heads 1902).

As noted above, light delivery efficiency in the illustrated embodiments is sensitive to vertical laser-to-slider positioning. Features described above such as CMP stops can help ensure accurate vertical alignment at the time of assembly. In other embodiments, the vertical alignment can be actively adjusted. In such a case, initial misalignments in the factory can be corrected, and later misalignments (e.g., due to thermal expansion) can also be corrected, e.g., using a controller. An active alignment system according to an example embodiment is shown in the block diagram of FIG. 20. A read/write head 2000 includes an actuator 2002 near a laser 2004 that can compensate or tune the sub-wavelength spatial path that could affect coupling between the laser output and an integrated waveguide 2006 or other light delivery component.

Figure 20:
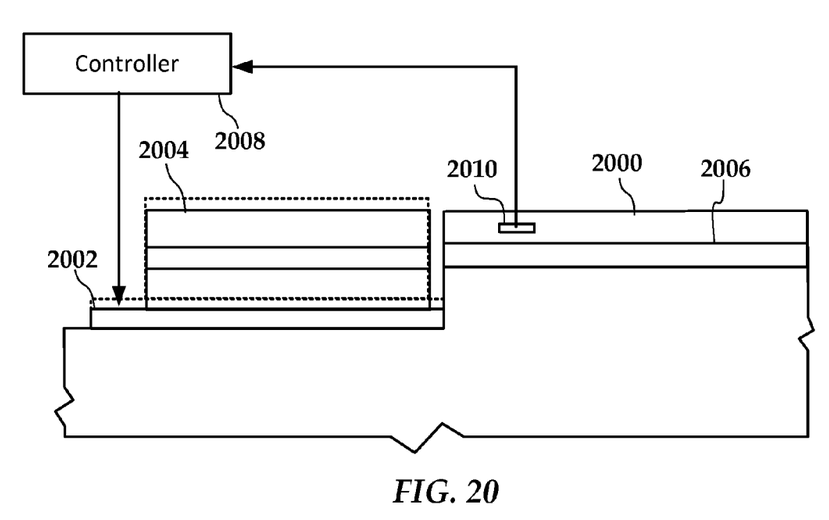
FIG. 20 is a block diagram showing an active alignment system according to an example embodiment.

The actuator 2002 may include a heater that causes a local protrusion of surrounding material. As indicated by the dotted lines, the protrusion can selectably shift a vertical alignment (and/or a horizontal alignment, rotation angle, etc.) between the laser 2004 and the waveguide 2006 for fine adjustment of sub-wavelength optical optimization. The vertical alignment can be tuned for optimal performance and/or minimize impact from a head heater used for clearance control. In other examples, the actuator 2002 can change vertical alignment to compensate for local thermal expansion caused by the laser 2004 itself. Other components may be used instead of a heater for the actuator 2002, such as a piezoelectric device.

The actuator 2002 may receive an electrical control signal from a controller 2008. The controller 2008 may receive feedback from a sensor 2010 along the light deliver path. Example sensors 2010 include photosensors, photovoltaic cells, and thermal sensors. The feedback signal can be used for closed-loop control of the vertical alignment. While the actuator 2002 is shown moving the laser 2004 relative to the read/write head 2000, a similar effect can be obtained by causing actuation of the waveguide 2006 or surrounding areas instead of or in addition to moving the laser 2004.

Figure 21:
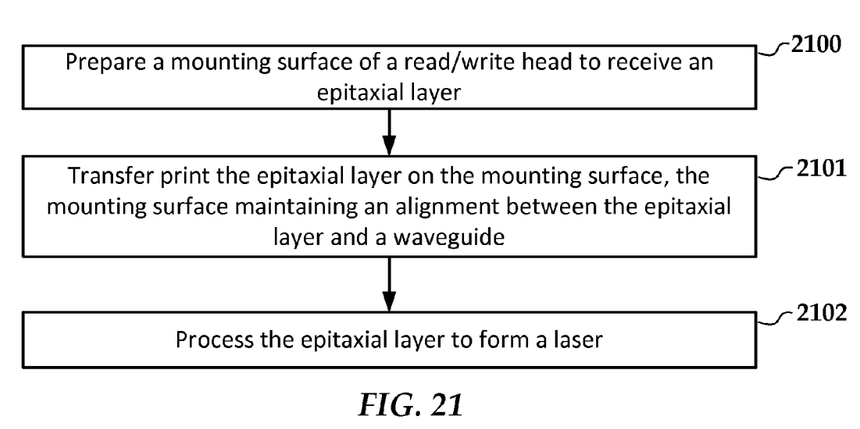
FIG. 21 is a flowchart showing a method according to an example embodiment.

In reference now to FIG. 21, a flowchart shows a method according to an example embodiment. The method involves preparing 2100 a mounting surface of a read/write head to receive an epitaxial layer. The mounting surface is proximate a waveguide of the read/write head, the waveguide configured to receive an optical output from the epitaxial layer. The epitaxial layer is transfer printed 2101 on the on the mounting surface. The mounting surface maintaining a vertical alignment between the optical output and the waveguide. The epitaxial layer is then processed 2102 to form a laser integrated with the read/write head.

Figure 22:
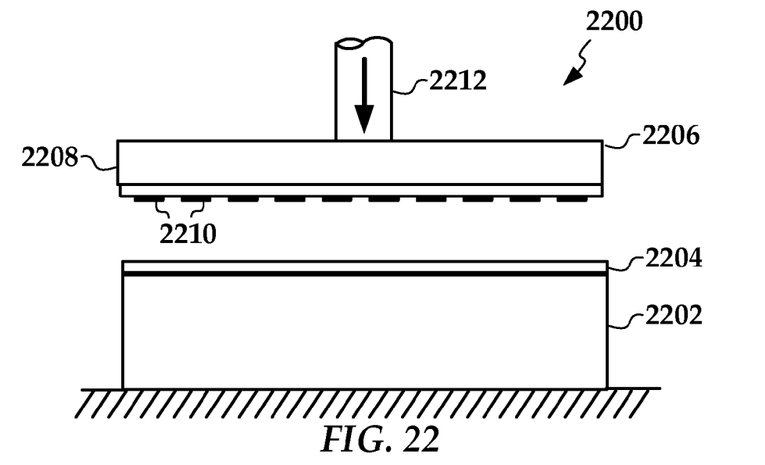
FIGS. 22-24 are block diagrams illustrating a manufacturing apparatus according to an example embodiment.

As noted above, the epitaxial layer attachment processes described above may be performed at wafer level. In such a case, a carrier having a large number of epitaxial layers is interfaced with a wafer that has a large number of read/write heads, attaching all of the epitaxial layers simultaneously. In reference now to FIGS. 22-24, block diagrams illustrate a manufacturing apparatus 2200 according to an example embodiment. The apparatus 2200 includes a fixture 2202 that hold a wafer 2204. The wafer 2204 includes a plurality of read/write heads. Each read/write head has a mounting surface proximate a waveguide of the read/write head, the waveguide configured to receive an optical output.

Figure 23:
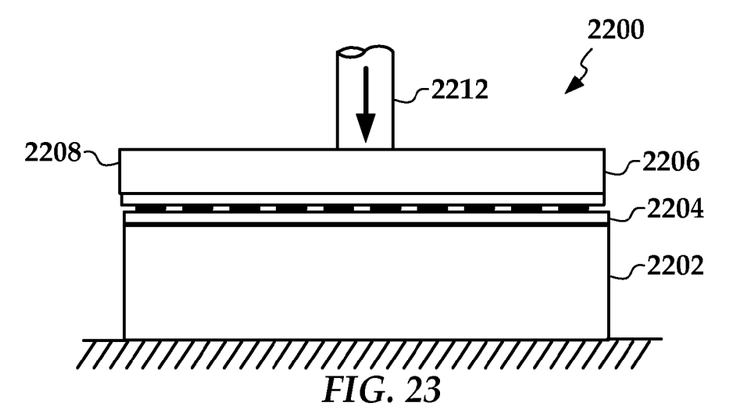
Figure 24:
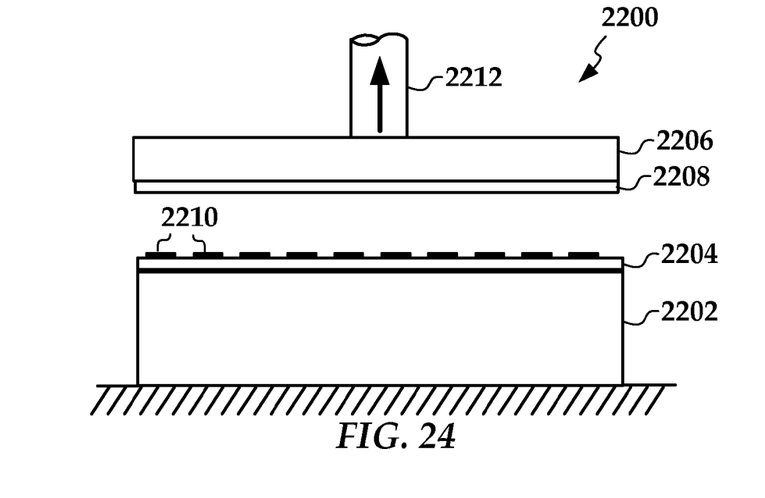

A holder 2206 is configured to hold a carrier film 2208. The carrier film 2208 has a plurality of epitaxial layers 2210 each corresponding to the respective mounting surfaces of the plurality of read/write heads. An actuator 2212 is configured to move the fixture 2202 and the holder 2206 together such that the epitaxial layers are attached to the mounting surfaces of the wafer 2204, as seen in FIG. 23. The mounting surfaces of the read/write heads maintain a vertical alignment between the epitaxial layers and the respective waveguides. As seen in FIG. 24, the holder 2206 is moved away from the fixture 2202, separating the epitaxial layers 2210 from the carrier film 2208, which completes the transfer print of the layers 2210. While this example shows the holder being moved, the fixture 2202 may be moved in addition to or instead of the holder 2206.

Although the subject matter has been described in language specific to structural features and/or methodological acts, it is to be understood that the subject matter defined in the appended claims is not necessarily limited to the specific features or acts described above. Rather, the specific features and acts described above are disclosed as representative forms of implementing the claims.

The invention claimed is:

1. A method comprising:
   preparing a mounting surface of a read/write head to receive an epitaxial layer, the mounting surface proximate a waveguide of the read/write head, the waveguide configured to receive an optical output from the epitaxial layer;
   transfer printing the epitaxial layer to the mounting surface, the mounting surface maintaining a vertical alignment between the optical output and the waveguide; and
   processing the epitaxial layer to form a laser integrated with the read/write head.

2. The method of claim 1, wherein preparing the mounting surface comprises:
   forming one or more vertical lapping stops on the read/write head;
   depositing a cladding layer of the waveguide over the vertical lapping stops; and
   planarizing the cladding layer to create the mounting surface aligned with the vertical lapping stops.

3. The method of claim 1, wherein preparing the mounting surface comprises depositing a bonding material to the mounting surface, the epitaxial layer being affixed to the mounting surface via the bonding layer.

4. The method of claim 1, wherein preparing the mounting surface comprises activating one or both of the mounting surface and the epitaxial layer via exposure to plasma.

5. The method of claim 1, further comprising adjusting a sub-wavelength path of at least one of the epitaxial layer and the waveguide via a heater embedded in the read/write head.

6. The method of claim 1, further comprising:
   etching a precision stopper surface on the target read/write head that facilitates precision lateral positioning between the epitaxial layer and a waveguide coupler; and
   etching a lateral reference surface into the epitaxial material, the lateral reference being laterally positioned against the precision stopper surface during the transfer printing.

7. The method of claim 6, further comprising, after the lateral reference features on the epitaxial layer are positioned against the precision stopper surface, etching a laser facet into the epitaxial layer with precise reference to the waveguide coupler.

8. The method of claim 1, wherein preparing the mounting surface comprises comprising forming a thermal conduction path under the epitaxial layer.

9. The method of claim 8, wherein processing the epitaxial layer comprises forming the thermal conduction path around the epitaxial layer.

10. The method of claim 8, wherein the thermal conduction path is mechanically compliant to reduce thermally-induced stresses on the epitaxial layer.

11. The method of claim 1 further comprising forming a thermomechanical wall around the epitaxial layer that buffers the epitaxial layer from thermomechanical stresses.

12. The method of claim 11, further comprising forming a layer of transparent material between the epitaxial layer and the thermomechanical wall.

13. The method of claim 11 wherein the thermomechanical wall comprises an opening that allow emissions outside of the thermomechanical wall.

14. The method of claim 1 further comprising forming a thermal layer between the epitaxial layer and the mounting surface that buffers the epitaxial layer from thermomechanical stresses.

15. The method of claim 1, further comprising forming a magnetic feature on the reference surface that pulls the epitaxial layer into a lateral alignment with the waveguide.

16. The method of claim 1, further comprising forming a sacrificial feature on a wafer that comprises the read/write head, the sacrificial feature facilitating measuring the optical output at a wafer level.

17. The method of claim 11, wherein the sacrificial feature comprises at least one of a grating, a photoluminescent material, and quantum dots.

18. The method of claim 1, further comprising forming a bolometer on one of the read/write head or a sacrificial region of a wafer that comprises the read/write head, the bolometer facilitating measuring the optical output at a wafer level.

19. A method comprising:
   forming an epitaxial layer on a donor substrate;
   separating the epitaxial layer from the donor substrate via a carrier;
   transfer printing the epitaxial layer to a mounting surface of a read/write head, the mounting surface maintaining a vertical alignment between the optical output and a waveguide configured to receive an optical output from the epitaxial layer; and
   processing the epitaxial layer to form a laser integrated with the read/write head.

20. The method of claim 19, further comprising, before transfer printing the epitaxial layer:
   forming one or more vertical lapping stops on the read/write head;

depositing a cladding layer of the waveguide over the vertical lapping stops; and planarizing the cladding layer to create the mounting surface aligned with the vertical lapping stops.

* * * * *